US005682067A

United States Patent [19]
Manley et al.

[11] Patent Number: 5,682,067
[45] Date of Patent: Oct. 28, 1997

[54] CIRCUIT FOR REVERSING POLARITY ON ELECTRODES

[75] Inventors: Barry W. Manley, Boulder, Colo.; Keith H. Billings, Guelph, Canada

[73] Assignee: Sierra Applied Sciences, Inc., Boulder, Colo.

[21] Appl. No.: 667,417

[22] Filed: Jun. 21, 1996

[51] Int. Cl.⁶ .................................................. C23C 14/34
[52] U.S. Cl. .................. 307/127; 307/138; 363/63; 204/192.12; 204/192.14; 204/298.08; 315/287; 361/245
[58] Field of Search ................... 307/125, 127, 307/138; 363/63, 84, 143; 315/209 R, 287, 307; 318/293; 320/25; 322/5; 327/29; 340/825.42, 825.43; 361/245, 246

[56] References Cited

U.S. PATENT DOCUMENTS

| | | | |
|---|---|---|---|
| 3,267,301 | 8/1966 | Gignac | 307/127 |
| 3,770,986 | 11/1973 | Drehle | 363/63 |
| 4,103,324 | 7/1978 | Vandervelen et al. | 204/298.08 |
| 4,868,504 | 9/1989 | Johnson | 307/138 |
| 4,914,356 | 4/1990 | Cockram | 315/307 |
| 4,931,169 | 6/1990 | Scherer et al. | 204/192.12 |
| 4,936,960 | 6/1990 | Siefkes et al. | 204/192.38 |
| 4,963,238 | 10/1990 | Siefkes et al. | 204/192.12 |
| 4,981,566 | 1/1991 | Wurczinger | 204/298.08 |
| 5,006,213 | 4/1991 | Sichmann et al. | 204/192.14 |
| 5,009,764 | 4/1991 | Siefkes et al. | 204/298.08 |
| 5,015,493 | 5/1991 | Gruen | 204/192.31 |
| 5,072,160 | 12/1991 | Yang | 315/287 |
| 5,074,984 | 12/1991 | Sichmann et al. | 204/192.14 |
| 5,108,571 | 4/1992 | Ludwig et al. | 204/192.13 |
| 5,109,162 | 4/1992 | Koch et al. | 307/127 |
| 5,126,033 | 6/1992 | Szczyrbowski et al. | 204/298.08 |
| 5,187,473 | 2/1993 | Guest | 307/127 |
| 5,192,894 | 3/1993 | Teschner | 204/298.41 |
| 5,286,360 | 2/1994 | Szczyrbowski et al. | 204/298.08 |
| 5,303,139 | 4/1994 | Mark | 363/63 |
| 5,352,955 | 10/1994 | Balland | 315/209 R |
| 5,357,419 | 10/1994 | Limpaecher | 363/140 |
| 5,427,669 | 6/1995 | Drummond | 204/298.08 |
| 5,502,630 | 3/1996 | Rokhvarg | 363/84 |
| 5,539,610 | 7/1996 | Williams et al. | 361/245 |

FOREIGN PATENT DOCUMENTS

| | | |
|---|---|---|
| 0553410 A1 | 8/1993 | European Pat. Off. . |
| 221202 A1 | 4/1985 | Germany . |
| 229160 A1 | 10/1985 | Germany . |
| 3919147 A1 | 12/1990 | Germany . |
| 3121389 A1 | 8/1992 | Germany . |
| 4113704 A1 | 10/1992 | Germany . |
| 57-69324 A | 4/1982 | Japan . |
| 63-190168 A | 8/1988 | Japan . |
| 3-56671 A | 3/1991 | Japan . |
| 3-61368 A | 3/1991 | Japan . |
| 2045553 | 3/1980 | United Kingdom . |

OTHER PUBLICATIONS

Beisswenger, T. et al., "Economical Considerations on Modern Web Sputtering Technology", Society of Vacuum Coaters, 35th Annual Technical Coinferece Proceedings, pp. 128–134 (1992).

Anderson, L., "A New Technique for Arc Control in DC Sputtering", Society of Vacuum Coaters, 35th Annual technical Conference Proceedings, pp. 325–329 (1992).

Schatz, Doug, "The MDX as a Strategic Tool in reducing Arcing", Application Notes, Advanced Energy Industries, Inc. (1985).

*Primary Examiner*—William M. Shoop, Jr.
*Assistant Examiner*—Peter Ganjian
*Attorney, Agent, or Firm*—Bruce E. Dahl; Klass, Law, O'Meara & Malkin, P.C.

[57] ABSTRACT

A circuit for reversing a voltage polarity on a first electrode and a second electrode may comprise a first inductor connected between the first electrode and a negative terminal of an external power supply. The positive terminal of the power supply is connected to the second electrode. A diode and a first capacitor are connected in series across the first and second electrodes so that the cathode of the diode is connected to the first electrode. A second capacitor and a switching device are also connected in series across the first and second electrodes. A second inductor is connected between the switching device and the anode of the diode.

23 Claims, 4 Drawing Sheets

CIRCUIT FOR REVERSING POLARITY ON ELECTRODES

FIELD OF INVENTION

This invention relates to plasma processing systems in general and more specifically to power supplies for D.C. plasma processing systems.

BACKGROUND

Plasma deposition is the name given to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Such plasma deposition processes may also be used in reverse, i.e., to remove material from the surfaces of objects, in which case they are usually referred to as plasma etching or plasma cleaning processes.

Regardless of whether the plasma process is used for deposition or cleaning, the plasma is usually created by subjecting a low-pressure process gas (e.g., argon) contained within a vacuum chamber to an electric field created between two electrodes. The electric field ionizes the process gas, creating the plasma. In the case of a sputter deposition plasma process, the ionized process gas atoms comprising the plasma impact the surface of the material (i.e., target) that is to be deposited on the object (i.e., substrate). As a result of the ion impacts, atoms of the target material are dislodged or sputtered from the surface of the target material and are released into the vacuum chamber. The substrate is usually positioned with respect to the target so that a majority of the sputtered atoms from the target material deposit themselves onto the surface of the substrate.

While sputter deposition processes of the type described above may be used to deposit metals or metal alloys (e.g., aluminum, nickel or cobalt) onto the substrate, they may be used to deposit compounds as well. Reactive sputter deposition is the name usually given to reactive sputtering processes which involve the sputtering of a metal or metal alloy in a reactive gas mixture in order to deposit a compound thin film comprising the sputtered material and the reactive species. A wide variety of compounds, such as $SiO_2$, $Al_2O_3$, $Si_3N_4$, and $TiO$, can be deposited by reactive sputtering.

While reactive sputtering processes are known and have been used for years, they continue to be plagued by the periodic occurrence of electrical discharges or arcs within the vacuum chamber. Such electrical discharges or arcs can take on different forms depending on the characteristics of the sputtering apparatus and on the particular plasma process being used. For example, arcs may occur between the target material, which is typically connected as the cathode in a DC sputtering process, and the substrate itself, certainly causing a defect in the coating, if not ruining the substrate entirely. Alternatively, the arc may occur between the target and some other part of the vacuum chamber, in which case the deleterious effects of the arc are usually less severe, but nevertheless tend to degrade the overall quality of the coating. The arcs can be short lived, lasting only a few milliseconds or so, or may be continuous, again depending on the particular apparatus and process being used. While such arcing can occur in nearly every kind of plasma process, the tendency of such arcs to occur is much greater in reactive processes where the compound film being deposited is an electrical insulator, such as $Al_2O_3$.

Several methods for preventing, or at least reducing the frequency of such arc discharges, rely on the selective control of the power supply used to place the charge on the electrodes. For example, one such method has been to simply turn-off the power supply as soon as an arc is detected, then turn it back on again once the arc has dissipated. While this method can effectively quench sustained arcs, the stored energy in most power supplies takes time to dissipate, increasing the response time, i.e., the time it takes to remove the electrical potential from the electrodes, to the point where such devices cannot effectively quench short duration arc events. Consequently, all that is really accomplished is a reduction in overall deposition rate, with little or no reduction in the adverse effects produced by the arc event itself.

Another control method has been to momentarily interrupt (i.e., disconnect) the power supply from the electrodes during the arc event. While the response time of this method is usually considerably faster, i.e., the voltage can be removed from the electrodes within a few milliseconds or so, it is difficult to dissipate the stored energy in the power supply. Consequently, such methods tend to stress the power supply or switching devices used to disconnect the power supply to the point of burn-out.

Another method of interrupting the voltage placed on the electrodes has been to use a tapped inductor connected in series between one terminal of the power supply and one of the electrodes. When an arc is detected, the center tap of the inductor is momentarily connected to the other terminal of the power supply. This has the effect of momentarily reversing the voltage on the electrodes. In certain cases, the magnitude of the reversed voltage charge is usually sufficient to quench the arc. Unfortunately, however, this method is not effective in suppressing arcs having impedances lower than the impedance of the switching network and center tap, which is a common occurrence. Consequently, the use of such center-tapped inductors has not proven to be a panacea.

While other devices exist and are being used with some degree of success, none are without their disadvantages. For example, may such other devices can only effectively suppress certain types of arc events or only arcs created under certain conditions. Other devices may have more effective arc suppression characteristics, but are usually plagued with complex electronic circuits and devices, which may be expensive to produce and/or prone to failure.

Consequently, a need exists for a method and apparatus for preventing and/or suppressing arc events in plasma processes and under various operating conditions. Such a method and apparatus should allow for the effective suppression of arcs under a wide range of conditions, but without the need to resort to expensive or complex circuit elements. Additional advantages could be realized if such a device could be used in conjunction with conventional power supplies.

SUMMARY OF THE INVENTION

A circuit for reversing a voltage polarity on a first electrode and a second electrode may comprise a first inductor connected between the first electrode and a negative terminal of an external power supply. The positive terminal of the power supply is connected to the second electrode. A diode and a first capacitor are connected in series across the first and second electrodes so that the cathode of the diode is connected to the first electrode. A second capacitor and a switching device are also connected in series across the first and second electrodes. A second inductor is connected between the switching device and the anode of the diode. The voltage polarity between the first and second electrodes may be reversed by actuating the switching device to switch between a non-conducting state and a conducting state. The voltage polarity may be returned to the normal polarity by again actuating the switching device to switch it from the conducting state to the non-conducting state.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
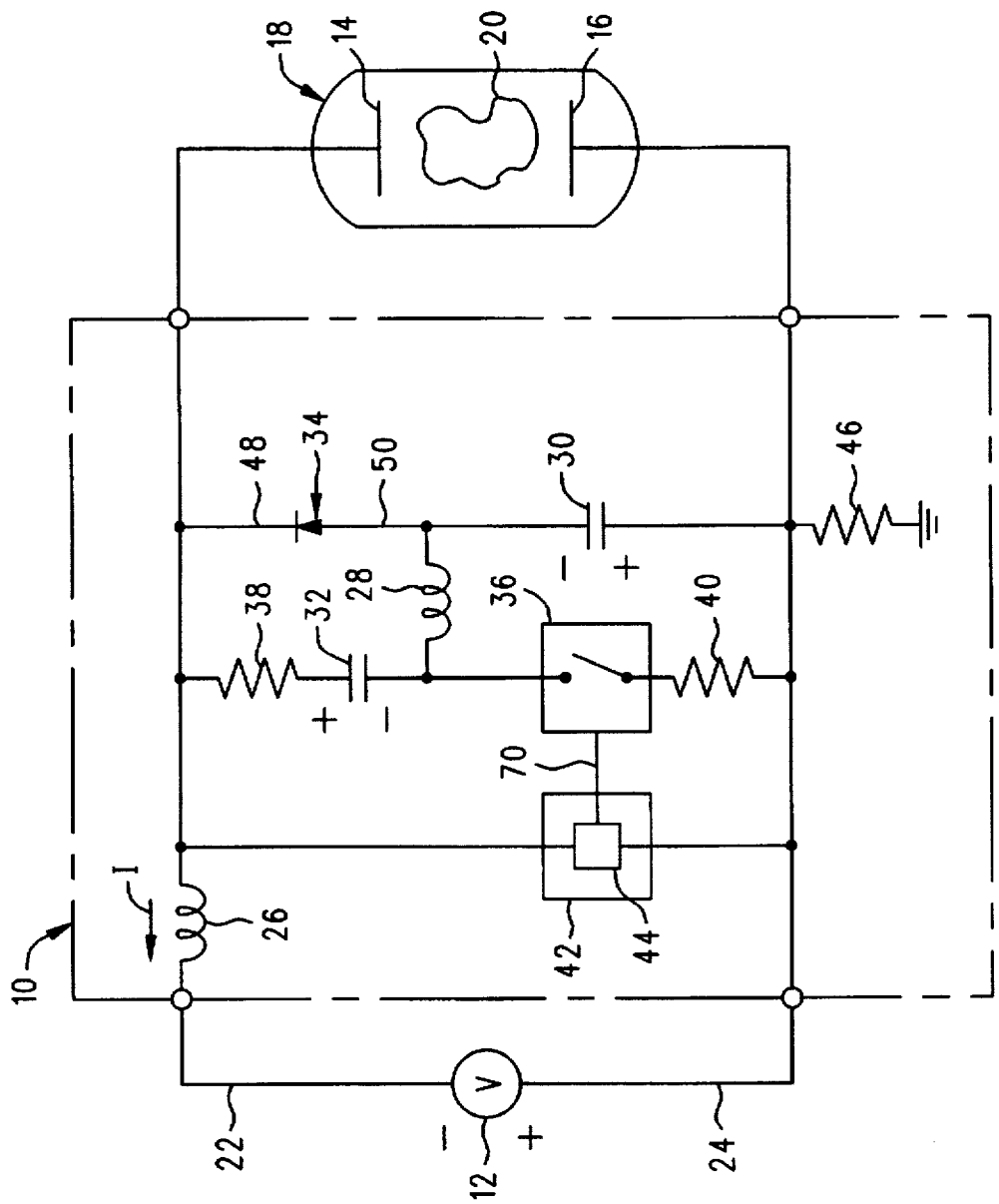
FIG. 1 is a schematic of a first embodiment of a circuit for reversing the polarity between two electrodes according to the present invention.

The improved circuit 10 for reversing the voltage potential on two electrodes according to one embodiment of the present invention is shown in FIG. 1 as it could be used with a conventional power supply 12 adapted for applying an electrical voltage potential between a first electrode 14 and a second electrode 16 mounted within a vacuum chamber 18. The vacuum chamber 18 may also include various other devices such as vacuum pumps, pressure regulators, cooling systems, etc., (not shown) that may be required to introduce into the vacuum chamber 18 the process gas (e.g., argon) and to maintain the pressure of the process gas within predetermined limits. In the case of a reactive plasma deposition process, the vacuum chamber 18 may also include additional, but similar, apparatus (also not shown) required to introduce into the vacuum chamber 18 the reactive gas (e.g., oxygen) and to maintain its pressure within predetermined limits.

The electric field created between the first and second electrodes 14 and 16 by the power supply 12 ionizes the process gas (not shown) to produce a plasma 20 for accomplishing the desired process (e.g., deposition or etching, as the case may be). In the embodiment shown in FIG. 1, the first electrode 14 is connected to the negative (−) terminal of the power supply 12 by any suitable connecting means, such as conductor 22. Similarly, the second electrode 16 is connected to the positive (+) terminal of power supply 12 via conductor 24. Therefore, the first electrode 14 serves as the cathode and the second electrode 16 serves as the anode.

The improved circuit 10 for momentarily reversing the polarity on the first and second electrodes 14, 16 (i.e. cathode and anode, respectively) is electrically positioned between the conductors 22 and 24 and may comprise a first inductor 26 connected in series between the negative (−) terminal of the power supply 12 and the first electrode 14 (e.g., the cathode). The first inductor 26 allows the power supply 12 to deliver a substantially constant current to the plasma 20 regardless of short duration voltage fluctuations that may occur as a result of changes in the plasma 20 or the overall process contained within vacuum chamber 18.

A first capacitor 30, along with a diode 34, are connected between the first and second electrodes 14 and 16 in the manner shown. A second capacitor 32 and a switching device 36 are also connected between the first and second electrodes 14 and 16 in a generally parallel arrangement with respect to the first capacitor 30 and diode 34. A second inductor 28 is connected between the first and second capacitors 30 and 32. As will be described in greater detail below, an optional first resistor 38 may be connected in series between the second capacitor 32 and the first electrode 14, and an optional a second resistor 40 may be connected between the switching device 36 and the second electrode 16. Similarly, an optional third resistor 46 may be connected between the second electrode 16 and ground.

The circuit 10 may also include a switch actuation circuit 42 for periodically cycling the switching device 36 between a non-conducting (e.g., open) state and a conducting (e.g., closed) state. In one preferred embodiment, the switch actuation circuit 42 may also include an arc detection circuit 44 for detecting the occurrence of an arc condition.

As will be explained in greater detail below, the second inductor 28, along with the respective first and second capacitors 30 and 32, forms an LC (i.e., inductive-capacitive) circuit which transfers energy stored in the second inductor 28 and first capacitor 30 into the second capacitor 32 during those times when the switching device 36 switches between the conducting state and the non-conducting state. Further, the first capacitor 30, along with diode 34, functions as a voltage limiter or clamp to prevent excessive negative voltages from being imposed on the cathode 14 immediately following the opening of switch device 36.

The improved circuit 10 according to the present invention may be operated in one of two modes depending on the desired performance of the circuit. In the first mode, referred to herein as the "passive arc suppression mode," the circuit 10 is operated in such a manner that the switch actuation circuit 42 periodically closes the switching device 36, thus reversing the polarity on the electrodes 14, 16. This periodic reversing of the polarity on the electrodes 14, 16 tends to remove any space charges that may have accumulated on the electrodes 14, 16, thereby effectively preventing the development of conditions likely to lead to arcing. In most processing modes, such a periodic voltage polarity reversal will be sufficient to prevent the occurrence of arcs. However, in the event more robust arc suppression is desired or required, the circuit 10 may be provided with an optional arc detection circuit 44.

When provided with the arc detection circuit 44, the overall circuit 10 may be operated in an "active arc suppression mode" in which the switching device 36 is actuated any time an arc condition is detected. As explained above, the actuation of the switching device 36 has the effect of almost immediately reversing the voltage potential on the electrodes 14 and 16, thus quenching the arc before it has a chance to fully develop and adversely affect the coating process.

Figure 2:
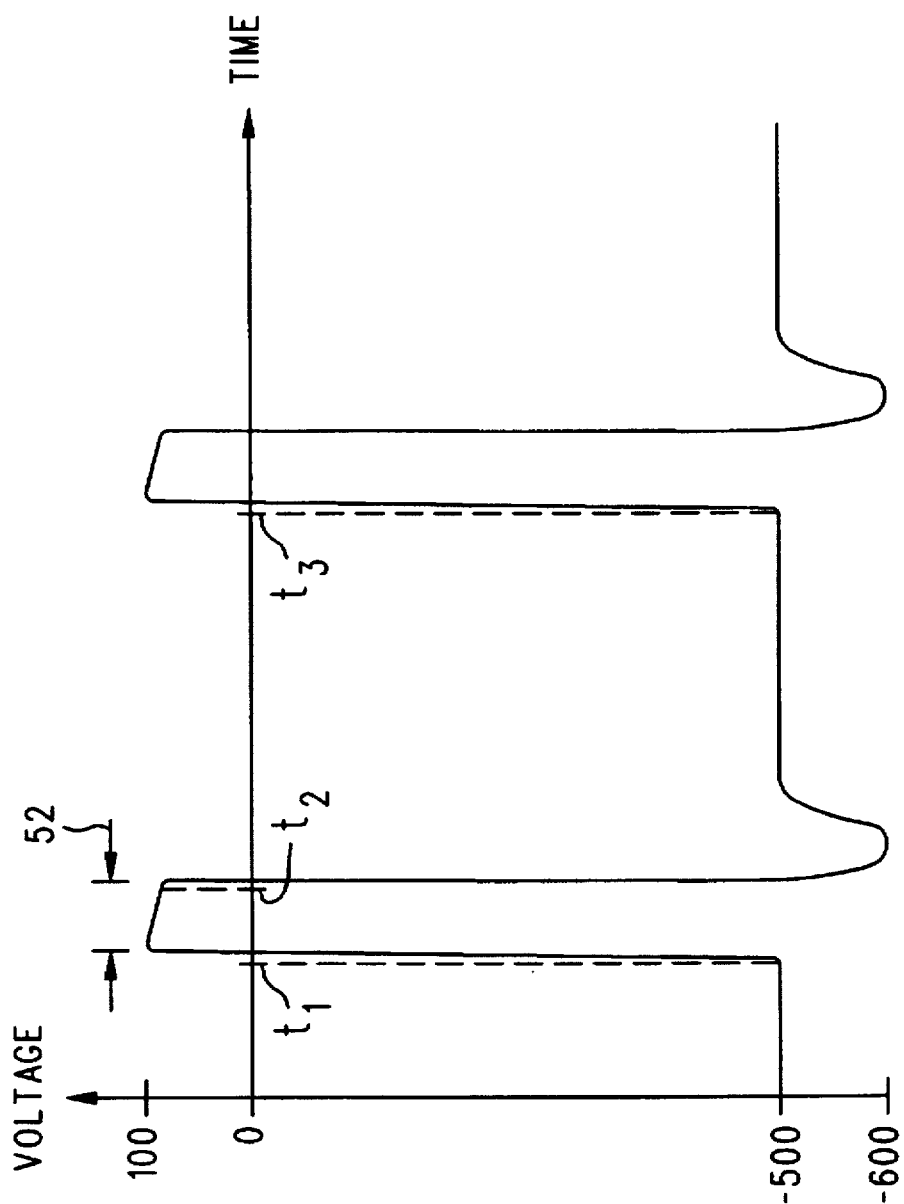
FIG. 2 is a graph of a typical voltage signal imposed on one of the two electrodes by the circuit according to the present invention.

The operation of the circuit 10 in the passive arc suppression mode is best understood by referring to FIGS. 1 and 2. In order to accomplish the desired plasma deposition process, the voltage on the first electrode 14 (i.e., the cathode) is maintained at a strong negative potential (e.g., −500 volts) with respect to the second electrode 16 (i.e., the anode) during the time when the switching device 36 is in the non-conductive state (i.e., open). During this time, the process is more or less operating in a steady state, with a substantially constant current I flowing through the first inductor 26 in the direction indicated by the arrow (i.e., the direction of positive current flow). As will be explained in greater detail below, the second capacitor 32 will have a net reverse charge (indicated by the "+" and "−" signs) across its plates with respect to the polarity of the electrodes 14 and 16. That is, the plate connected to the first electrode 14 will have a voltage potential substantially equal to the voltage potential on the electrode 14 (e.g., −500 V), while the other plate, i.e., the plate connected to the second inductor 28, will have a slightly greater negative voltage (e.g., −600 V). Consequently, the second capacitor will have a relative charge as indicated by the (+) and (−) signs shown in FIG. 1. The first capacitor 30 will essentially have the relative charge in the sense also indicated by the (+) and (−) signs shown in FIG. 1.

At a certain time $t_1$ (FIG. 2), the switch actuation circuit 42 actuates the switching device 36 to change it from the non-conductive (i.e., open) state to the conductive (i.e., closed) state. The second capacitor 32 will now be connected directly across the first and second electrodes 14 and 16, essentially instantly reversing the charge on the electrodes. That is, the charge on the first electrode 14 will now be essentially 100 volts positive with respect to the charge on the second electrode 16. See FIG. 2. This 100 volt potential, plus the 500 volt potential of the power supply, i.e., a total of 600 volts, is impressed across inductor 26, causing the current I flowing through the first inductor 26 to increase in a substantially linear fashion.

Before the second capacitor 32 is discharged by a significant amount, the switch actuation circuit 42 again actuates the switching device 36, causing it to return to the non-conductive (i.e., open) state at a time $t_2$. At this point, the increased current I flowing through the first inductor 26 causes the voltage on the first electrode 14 to more or less instantly swing negative with respect to the second electrode 16. However, instead of stopping at the previous potential of about −500 V, the increased current I flowing through the first inductor 26 and the increased initial impedance of the non-conducting plasma 20 causes the voltage on the first electrode 14 to continue to go negative. The first capacitor 30 and the diode 34 now act as a voltage limiter or clamp to prevent the voltage on the first capacitor 30 from exceeding about −600 volts. The clamped energy is stored in capacitor 30. Then, as the plasma begins to conduct, the voltage on the first electrode decreases until it again reaches about −500 volts with respect to the second electrode 16 and the current I through the first inductor 26 decays to its original value. The switching device 36 remains in the non-conducting (i.e., open) state until a time $t_3$, when it is again switched to the conducting (i.e., closed) state, as described above.

The second inductor 28 prevents excessive current from flowing through the switching device 36 when it is conducting. The second inductor 28 also provides resonant recharging of the second capacitor 32 from the first capacitor 30 when the switching device 36 is in the non-conducting state. That is, the charge collected by the first capacitor 30 during the clamping process is transferred to the second capacitor 32 when switching device 36 is in the non-conducting state.

If the circuit 10 is provided with an arc detection circuit 44, then it may be operated in the "active arc suppression mode." The active arc suppression mode is essentially identical to the passive arc suppression mode except that the switching device 36 is activated (i.e., closed) whenever an arc condition is detected by the arc detection circuit 44.

Therefore, when operated in the active mode, the circuit 10 will be capable of quenching an arc that may unexpectedly develop during the time between the periodic voltage reversal cycles 52, e.g., during the time between $t_2$ and $t_3$.

A significant advantage of the improved circuit 10 according to the present invention is that it allows the voltage potential between the electrodes 14, 16 to be almost instantly reversed to discourage the formation of an arc condition within the plasma chamber 18. Unlike previous circuits, the improved circuit 10 transfers the energy stored in the first capacitor 30, the first inductor 26, and the vacuum chamber 18 during the voltage reversal (i.e., chamber restart) period into the second capacitor 32, thus preventing undue stress from being imposed on the power supply 12 or the switching device 36, thus substantially increasing the reliability and overall lifetime of both devices. Another advantage of the present invention is that it does not require complex circuitry or components, which can be expensive and subject to failure. Still another advantage is that the improved circuit 10 according to the present invention may be used with conventional power supplies without the need to modify the power supplies.

Still other advantages are associated with the combination of the first and second capacitors 30 and 32 and the second inductor 28. These circuit elements together form an LC resonant circuit whereby the energy stored in the first capacitor 30 during clamping is transferred first to the second inductor 28 and then to the second capacitor 32 when the switching device 36 is in the non-conducting state. This stored energy is then transferred from those elements back into the plasma circuit upon resumption of normal operation. Consequently, very little energy is wasted, nor is there a concern about the energy stored in the chamber 18 and inductor 26 damaging the internal components of the power supply 12 or the switching device 36.

Yet another advantage of the present invention 10 is that the first capacitor 30 and diode 34 form a voltage limiter or clamp to prevent the first inductor 26 from imposing excessive negative voltages on the first electrode 14 when the switching device 36 is opened. Instead, the energy is stored in the second inductor 28 and the first and second capacitors 30 and 32, and is later used to reverse the voltage on the electrodes 14 and 16.

Having briefly described the improved circuit 10 for reversing the voltage polarity on electrodes, as well as some of its more significant features and advantages, the details of the improved circuit 10 according to the present invention will now be described in detail. Referring back now to FIG. 1, the improved circuit 10 is shown as it may be used in conjunction with a conventional DC power supply 12 of the constant voltage design. However, other types of power supplies, such as constant current power supplies, could also be used. In the case of a DC plasma sputter deposition process, the negative (−) terminal of the power supply 12 is connected to the first electrode 14 by any convenient connector means, such as a conductor 22. Similarly, the positive (+) terminal of the power supply 12 may be connected to the second electrode 16 by a second conductor 24. When connected in this manner, the first electrode 14 is said to be the cathode and the second electrode 16, the anode.

The first and second electrodes 14 and 16 are positioned within a vacuum chamber 18 and may be connected in any of a variety of ways well-known in the art depending on the particular plasma process to be performed. For example, if sputter deposition is to be performed within the chamber 18, a target (not shown) is usually connected as the cathode or first electrode 14. The second electrode 16 or anode may comprise a separate component or, as is commonly the case, may comprise the vacuum chamber 18 itself. Of course, the vacuum chamber 18 may also include a variety of other components and devices necessary to accomplish the desired plasma process. For example, the vacuum chamber 18 will usually be connected to a supply of a suitable process gas (not shown), such as argon, as well as a suitable pumping apparatus (also not shown) to maintain the process gas contained within the chamber 18 at the desired pressure. If reactive sputtering is to be performed, then the vacuum chamber 18 will also be connected to a supply of the reactive species (not shown), such as oxygen. A valve assembly (not shown) will also usually be included to allow for the precise adjustment of the flow of the reaction gas into the chamber 18. The vacuum chamber 18 may also include various other systems, such as cooling systems, process monitoring systems, etc., all of which are well-known in the art and could be easily provided by persons having ordinary skill in the art. Consequently, the vacuum chamber 18 will not be described in further detail.

The voltage reversal circuit 10 comprises a first inductor 26 connected in series with the negative (−) terminal of power supply 12 and the first electrode (i.e., cathode) 14 contained within the vacuum chamber 18. The first inductor 26 adds a substantial amount of reactance to the circuit 10 thus allowing the plasma process to operate at substantially constant current, at least for short term transient impedance variations that may occur in the plasma 20. That is, the current flowing through the plasma 20 will be substantially constant regardless of the voltage potential between the two electrodes 14 and 16. While the amount of inductance of the first inductor 26 is not particularly critical, it should be large enough to provide sufficient reactance to the circuit to allow the plasma process to be operated at substantially constant current for the typically expected transient impedance variations in the plasma 20. In one preferred embodiment, the first inductor 26 comprises a 1.5 millihenry (mH) choke.

The cathode 48 of diode 34 is also connected to the first electrode 14, whereas the anode 50 is connected to one lead of a first capacitor 30. The other lead of first capacitor 30 is connected to the second electrode 16. As was described above, the series arrangement of the first capacitor 30 and diode 34 forms a voltage limiter or clamp to prevent excessive negative voltages from being imposed on the first electrode 14 when the switching device 36 is opened. The selection of the diode 34 will, of course, depend on the capacity of the particular power supply 12, the expected peak voltages and currents, as well as the values chosen for the other components in the circuit 10. However, in one preferred embodiment, the diode 34 may comprise a single diode rated for 800 volts and 6 amperes. Alternatively, a combination of diodes may be used, as would be obvious to persons having ordinary skill in the art.

The value of the first capacitor 30 must be selected so that it will not discharge significantly during the longest conducting period of switching device 36 at the maximum load current, i.e., the time between $t_1$ and $t_2$. Further, the LC resonant circuit that comprises the first and second capacitors 30 and 32 and the second inductor 28 should have a sufficiently long time constant so that the second capacitor 32 will be positively charged when the switching device 36 is again switched to the conducting state. The range of values for the first capacitor 30 will be described later.

The second capacitor 32 and the switching device 36 are connected in series across the first and second conductors 22 and 24 in the manner shown in FIG. 1. It is preferred, but not required, that a first resistor 38 be connected in series between the capacitor 32 and the conductor 22 and a second resistor 40 be connected in series between the switching device 36 and the conductor 24. Although both resistors 38 and 40 act as current limiters to protect their associated components, resistor 40 also provides current limiting information to the switch actuation circuit 42. In one preferred embodiment, the first resistor 38 may have a value in the range of 1 ohm (Ω) to 50Ω (8Ω preferred). The second resistor 40 may have a value in the range of 10 megaohms (MΩ) to 100MΩ (50MΩ preferred). Finally, the second inductor 28 is connected between the first and second capacitors 30 and 32, respectively.

As was described above, the first and second capacitors 30 and 32, along with the second inductor 28, form an LC resonant circuit. In order to provide good performance, the time constant of the resonant circuit should be selected so that it is at least four (4) times longer than the expected length of the non-conducting period of switching device 36 (i.e., the period between $t_2$ and $t_3$) at the slowest cycle rate. See FIG. 2. It is preferred, but not required, that the time constant of the LC resonant circuit be about one (1) order of magnitude (i.e., about 10 times) longer than the length of the non-conducting period (i.e., $t_3$–$t_2$). Thus, in one preferred embodiment having a non-conducting time period $t_3$–$t_2$ in the range of 20–60 μs, the time constant of the resonant circuit should be selected to be about 600 μs. Therefore, any values for the second inductor 28 and the first and second capacitors 30 and 32 that will yield such a time constant usually will suffice. In one preferred embodiment, the first capacitor 30 has a value in the range of about 1 microfarad (Mf) to 10 μF (1 μF preferred), the second capacitor 32 a value in the range of 1 μF to 10 μF (1 μF preferred), and the inductor 28 has a value of about 5 millihenry (mH) to 10 mH (10 mH preferred).

The switching device 36 may comprise any number of semiconductor switching devices suitable for switching the anticipated currents at a suitable speed (e.g., 0.1 μs). Examples of such semiconductor switching devices include, but are not limited to, bi-polar transistors, insulated gate bi-polar transistors (IGBTs), field-effect transistors (FETs), metal-oxide semiconductor field-effect transistors (MOSFETs), etc., that are readily commercially available and well-known to persons having ordinary skill in the art. Alternatively, non-semiconductor switching devices may also be used, provided such devices are capable of switching the anticipated voltages and currents at the speeds required. Consequently, the present invention should not be regarded as limited to any particular switching device or family of switching devices. However, in order to assist in the understanding of the circuit 10, the switching device 36 used in one particular embodiment will now be described.

Figure 3:
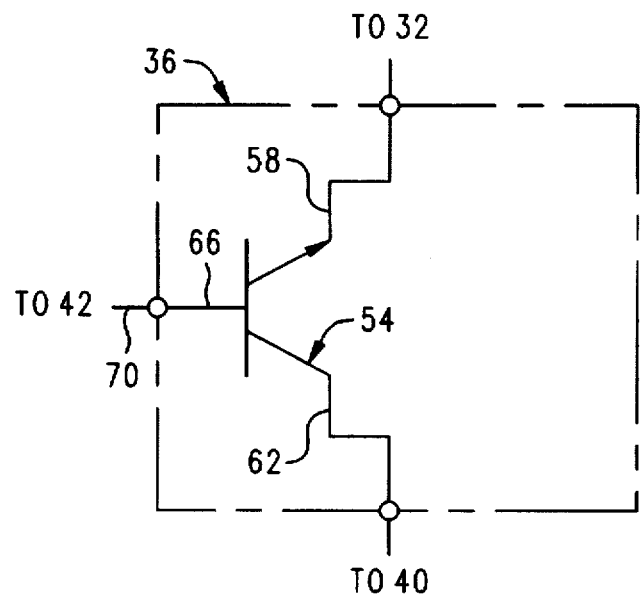
FIG. 3 is a schematic of one embodiment of a switching device that could be used with the present invention.

Referring to FIG. 3, one type of switching device 36 may comprise a single high-speed bi-polar switching transistor 54. More specifically, the emitter 58 of transistor 54 is connected to the second capacitor 32, while the collector 62 is connected to resistor 40. See also FIG. 1. The base 66 of transistor 54 is connected to the switch actuation circuit 42 (FIG. 1). In most applications, the switching device 36 must be capable of switching potentials of about 1000 V or greater and at currents commensurate with the power of the system. In one preferred embodiment, the switching transistor 54 comprises an insulated gate bi-polar transistor (IGBT) of the type which are readily commercially available. However, as was mentioned above, a number of other types of semiconductor switching devices (e.g., FETs, MOSFETs, etc.) or even non-semiconductor switching devices are available and could be substituted for the transistor arrangement set forth in FIG. 3 and described above, as would be obvious to persons having ordinary skill in the art.

The switch actuation circuit 42 may comprise any of a number of circuits well-known in the art for periodically actuating the switching device 36 to change it from a non-conducting state to a conducting state. In one preferred embodiment, the switch actuation circuit 42 would accomplish the actuation of switching device 36 by applying the appropriate base current to the transistor 54 to switch it from a non-conducting state to a conducting state at the desired time intervals. That is, the switch actuation circuit 42 should be designed to provide a switch actuation signal 70 to the switching device 36 at any of a range of frequencies suitable for providing an acceptable level of arc suppression for the particular plasma process being performed. In one preferred embodiment adapted for a reactive sputter deposition process, the switch actuation circuit activates (i.e., closes) the switching device 36 for about 2–5 μs (i.e., the reverse polarity cycle time 52 shown in FIG. 2), at a frequency of about 50 kHz, although other cycle times 52 and frequencies could also be used without departing from the spirit and scope of this invention.

As was mentioned above, the present invention 10 can be operated in the "passive arc suppression mode" if it does not include the optional arc detection circuit 44. When operating in the passive arc suppression mode, the switch actuation circuit 42 simply provides a switch actuation signal 70 to the switching device 36 for a time (i.e., reverse polarity cycle time 52) and at a frequency that may be appropriate for the particular plasma process being used.

The operation of the circuit 10 in the passive arc suppression mode is best understood by referring to FIGS. 1 and 2. For example, if the circuit 10 is to be used with a reactive sputter deposition process, a suitable power supply 12 is provided to maintain the voltage on the first electrode 14 (i.e., the cathode) at a strong negative potential (e.g., –500 volts) with respect to the second electrode 16 (i.e., the anode) during the time when the switching device 36 is in the non-conductive state (i.e., open). During this time, the reactive sputtering process (at least as far as the power supply circuit is concerned) is more or less operating in a steady state, with a substantially constant current I flowing through the first inductor 26 in the direction indicated by the arrow (i.e., the direction of positive current flow). The second capacitor 32 will have a net reverse charge (indicated by the "+" and "(–)" signs) across its plates with respect to the polarity of the electrodes 14 and 16. That is, the plate connected to the first electrode 14 will have a voltage potential substantially equal to the voltage potential on the electrode 14 (e.g., –500 V), while the other plate, i.e., the plate connected to the second inductor 28, will have a slightly greater negative voltage (e.g., –600 V). The first capacitor 30 will essentially have the relative charge in the sense also indicated by the (+) and (–) signs shown in FIG. 1. At a certain time $t_1$ (FIG. 2), the switch actuation circuit 42 actuates the switching device 36 to change it from the non-conductive (i.e., open) state to the conductive (i.e., closed) state. When the switching device 36 closes, the second capacitor 32 is connected directly across the first and second electrodes 14 and 16, essentially instantly reversing the voltage potential on the electrodes. That is, the charge on the first electrode 14 is now essentially 100 volts positive with respect to the charge on the second electrode 16. See FIG. 2. At this time, the second capacitor 32 begins to discharge through the power supply 12 and first inductor 26. The voltage on the second capacitor 32 plus the power supply voltage is impressed across the first inductor 26 causing the current I flowing through the first inductor 26 to increase in a substantially linear fashion in accordance with the well-known proportionality relation:

$$\frac{\Delta I}{\Delta t} \propto \frac{V}{L} \quad (1)$$

where

V=the instantaneous voltage across the first inductor 26;
L=the inductance of the first inductor 26 at the loaded current; and
ΔI/Δt=the incremental time rate of change of the current I flowing through the inductor 26.

As was described above, the capacitance of the second capacitor 32 is selected so that it does not discharge by a significant amount before the switch actuation circuit 42 again actuates the switching device 36 causing it to return to the non-conductive (i.e., open) state at a time $t_2$. As soon as switching device 36 is opened, the increased current I flowing through the first inductor 26 causes the voltage on the first electrode 14 to more or less instantly swing negative with respect to the second electrode 16. However, instead of stopping at the previous potential of about –500 V, the increased current I flowing through the first inductor 26 and the high impedance of the plasma 20 causes the voltage on the first electrode 14 to continue to go negative. The first capacitor 30 and the diode 34 form a voltage limiter or clamp and prevent the voltage from exceeding about –100 volts greater than the normal working voltage (e.g., about –600 volts in one preferred embodiment). Then, as the current I through the first inductor 26 decays to its original value and the plasma conduction is established, the voltage on the first electrode decreases until it again reaches about –500 V with respect to the second electrode 16.

The second inductor 28 prevents excessive current from flowing through the switching device 36 and first capacitor 30 during the conducting period of the switching cycle. That is, during the conducting period, the current flowing through the second inductor 28 increases, transferring energy from the first capacitor 30 to the second inductor 28. When the switching device 36 switches to the non-conducting state (e.g., at time $t_2$), the second inductor 28 drives current into the second capacitor 32, thus recharging the second capacitor 32 for the next cycle.

Figure 4:
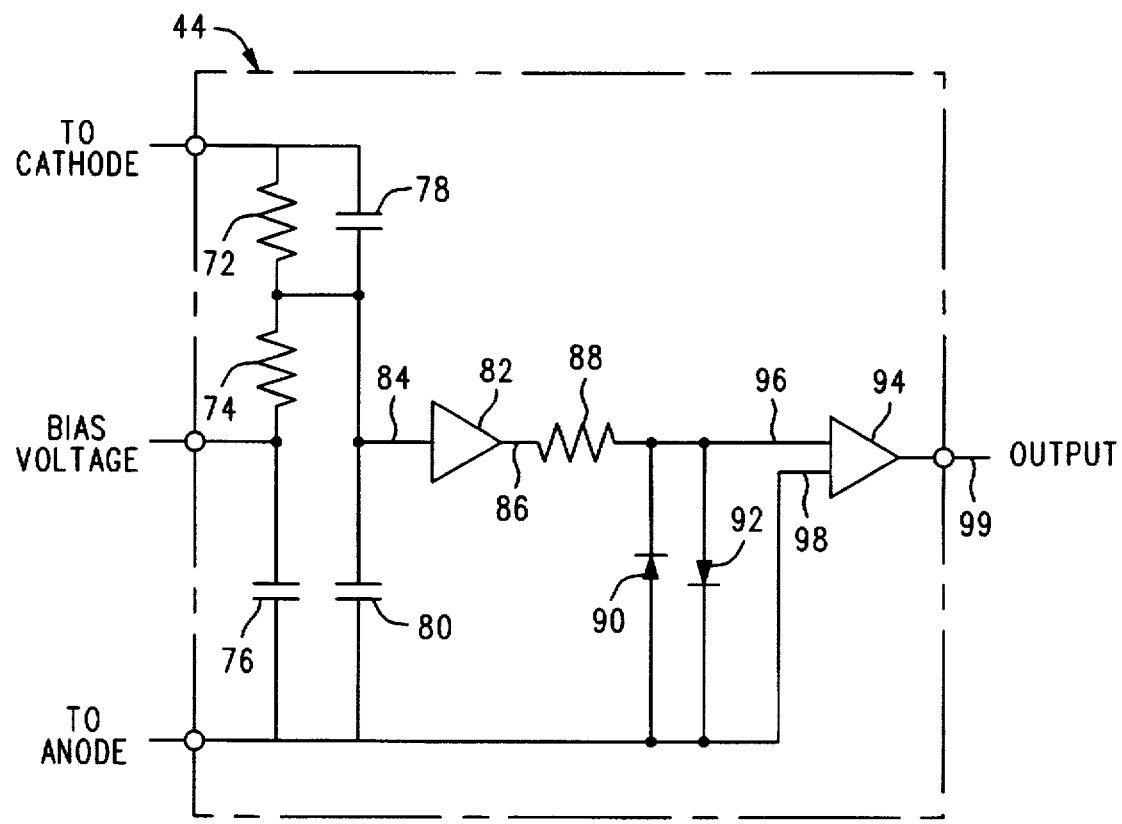
FIG. 4 is a schematic of one embodiment of an arc detection circuit that could be used with the present invention.

In certain circumstances, it may be advantageous to enhance the arc suppression capabilities of the circuit 10 described above by connecting an arc detection circuit 44 to the switch actuation circuit 42. As was mentioned above, the arc detection circuit 44 works in concert with the normal operation of the switch actuation circuit 42 to reverse the voltage potential on the electrodes 14, 16 if an arc condition is detected during the time when the switching device 36 is in the non-conductive (i.e., open) state (e.g., during the time between $t_2$ and $t_3$). While many different kinds of arc detection devices are known and may be used with the present invention, one preferred embodiment of the present invention uses an arc detection circuit 44 substantially as shown in FIG. 4.

Essentially, arc detection circuit 44 may comprise first and second resistors 72 and 74 connected in series with a first capacitor 76 across the first and second electrodes (e.g., the cathode and the anode) 14 and 16. See FIG. 1. A second capacitor 78 is connected in parallel with the first resistor 72. A third capacitor 80 is connected in series with the second capacitor 78 so that it is also connected in parallel with the series arrangement of resistor 74 and capacitor 76. The combination of resistors 72, 74 and capacitors 78 and 80 form a compensated voltage divider network which provides to the buffer amplifier 82 a reduced-voltage signal 84 that more accurately represents the actual voltage signal (i.e., wave-form) on the first and second electrodes 14 and 16, than is possible with conventional, purely resistive voltage divider networks. A bias voltage is applied to resistor 74 to define the voltage level at which an arc is to be recognized. That is, an arc condition is assumed to exist and is recognized by the arc detection circuit 44 if the voltage potential between the electrodes starts to decrease and passes through a defined voltage level. The defined voltage level can be varied by adjusting the magnitude of the bias voltage applied to resistor 74.

The reduced voltage signal 84 from the compensated voltage divider network is then fed into buffer amplifier 82. The output signal 86 from buffer amplifier 82 is fed via resistor 88 to a diode clamp circuit comprising diodes 90 and 92. Under normal circumstances, the output signal 86 from buffer amplifier 82 will be negative. Hence, current will flow via resistor 88 and diode 90 and a negative clamped voltage of about 0.6 volts will appear across the input leads 96, 98 of comparator 94. Conversely, if the output signal 86 from amplifier 82 goes positive, diode 92 will conduct, again imposing a clamped voltage of about 0.6 volts across input leads 96 and 98 of amplifier 94. The arrangement of diodes 90 and 92, along with resistor 88, forms a non-linear voltage divider network which substantially reduces the input impedance presented to the input of comparator 94, thus removing a substantial amount of the RF (i.e., radio frequency) noise present in the output signal 86. The comparator 94 produces an output signal 99 when the voltage across its input leads 96, 98 passes through zero. The output signal 99 from comparator 94 may then be fed into the switch actuation circuit 42 to trigger the switching device 36. It should be noted that in this application it will be desirable to design the arc detection circuit 44 so that it will ignore the low voltage on the first electrode 14 (i.e., cathode) if the low voltage occurs during the normal reverse polarity cycle 52 of the switch actuation circuit 42, i.e., during normal pulsing.

As was described above, the provision of an arc detection circuit, such as circuit 44, will allow the circuit 10 to be operated in either the passive arc suppression mode described above or in an active arc suppression mode. The operation of the circuit 10 in the active arc suppression mode is essentially the same as the operation of the circuit in the passive mode, except that the switch actuation circuit 42 will actuate the switching device 36 upon the detection of an arc event by circuit 44 that may occur between the normal reverse polarity cycle times 52 (e.g., during the time between $t_2$ and $t_3$). See FIG. 2.

Figure 5:
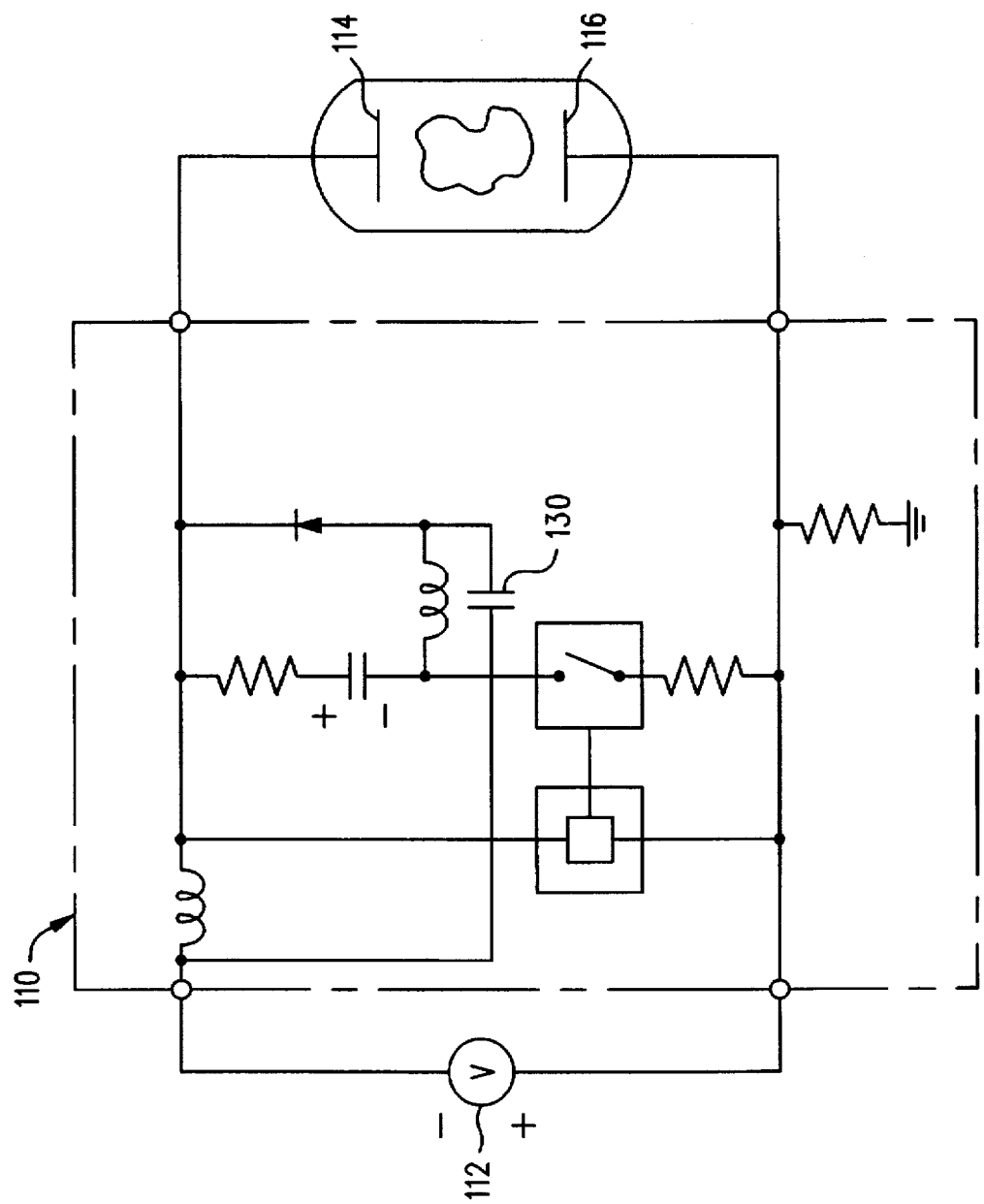
FIG. 5 is a schematic of a second embodiment of a circuit for reversing the polarity between two electrodes.

A second embodiment 110 of the circuit for reversing the voltage polarity between two electrodes 114 and 116 is shown in FIG. 5. The second embodiment 110 is essentially identical to the first embodiment 10, except that the first capacitor 130 may be connected to the negative (−) terminal of the power supply 112, instead of the positive (+) terminal, as was the case for the first embodiment 10. The function and operation of the second circuit 110 is in every way identical to the function and operation of the first circuit 10, except that the voltage potential across capacitor 130 usually will be only the difference between the normal operation negative voltage (e.g., −500 V) on the first electrode (cathode) 114 and the peak negative voltage imposed (e.g., −600 V) on the electrode 114 when the switching device 136 is opened. See FIG. 2. That is, the maximum voltage potential across capacitor 130 is only about 100 V, instead of about 600 V, which was the case for capacitor 30 in the first embodiment 10.

This completes the detailed description of the preferred embodiments of the circuits for reversing the voltage polarity between two electrodes. While a number of specific components were described above for the preferred embodiments of this invention, persons skilled in this art will readily recognize that other substitute components or combinations of components may be available now or in the future to accomplish comparable functions to the apparatus described herein. For example, while the circuits 10 and 110 were shown as they could be used with power supplies 12 and 112 having a certain polarity, the polarity of the power supplies 12 and 112 could be reversed by simply reversing the connections of the cathode 48 and anode 50 of diode 34. Of course, it may also be necessary to slightly modify the switching device 36, the switch actuation circuit 42, and the arc detection circuit 44, depending on the specific design of those circuits. In any event, such modifications for reversed polarity power supplies would be obvious and could be readily made by persons having ordinary skill after having become familiar with the details of the present invention.

Still other modifications are possible. For example, while the present invention was shown and described herein as it could be used with a plasma process of the DC sputter deposition type, the present invention could also be used with other plasma processes requiring periodic voltage reversal between the process electrodes, either to enhance the process or to provide improved arc suppression characteristics. Consequently, the present invention should not be regarded as limited to use with DC sputter deposition processes.

Therefore, it is contemplated that the inventive concepts herein described may be variously otherwise embodied and it is intended that the appended claims be construed to include alternative embodiments of the invention except insofar as limited by the prior art.

What is claimed is:

1. A circuit for reversing a voltage polarity on a first electrode and a second electrode, comprising:

a first inductor;

means for connecting said first inductor between the first electrode and a negative terminal of an external power supply;

means for connecting the second electrode to a positive terminal of the external power supply;

a diode having a cathode and an anode;

means for connecting the cathode of said diode to the first electrode;

a first capacitor;

means for connecting said first capacitor between the anode of said diode and the second electrode;

a second inductor having a first lead and a second lead;

means for connecting the first lead of said second inductor to the anode of said diode;

a second capacitor;

means for connecting said second capacitor between the second lead of said second inductor and the first electrode; and switching means connected between the second lead of said second inductor and a positive terminal of the external power supply for selectively connecting the second lead of said second inductor to the positive terminal in response to a switch actuation signal.

2. The polarity reversing circuit of claim 1, further comprising switch actuation means connected to said switching means for periodically producing the switch actuation signal to switch said switching means from a non-conducting state to a conducting state.

3. The polarity reversing circuit of claim 2, further comprising arc detection means connected to said switch actuation means for detecting the occurrence an arc condition and for generating the switch actuation signal to switch said switching means from the non-conducting state to a conducting state when the arc condition is detected.

4. The polarity reversing circuit of claim 3, wherein said arc detection means comprises a non-linear voltage divider network for sensing the voltage across the first and second electrodes and for producing a low-noise output signal related thereto.

5. The polarity reversing circuit of claim 1, further comprising a first resistor connected in series between said second capacitor and the first electrode.

6. The polarity reversing circuit of claim 5, further comprising a second resistor connected in series between said switching means and the positive terminal of the external power supply.

7. The polarity reversing circuit of claim 6, wherein said switching means comprises a semiconductor switching device switchable from the non-conducting state to the conducting state in response to the switch actuation signal.

8. The polarity reversing circuit of claim 7, wherein the external power supply comprises a constant voltage power source.

9. The polarity reversing circuit of claim 7, wherein the external power supply comprises a constant current power source.

10. A circuit for reversing a voltage polarity on a first electrode and a second electrode, comprising:

a first inductor connected between the first electrode and a negative terminal of an external power supply;

a diode having a cathode and an anode, the cathode being connected to the first electrode;

a first capacitor connected between the anode of said diode and a positive terminal of the external power supply, the positive terminal of the external power supply also being connected to the second electrode;

a second inductor having a first lead and a second lead, the first lead being connected to the anode of said diode;

a second capacitor connected between the second lead of said second inductor and the first electrode; and switching means connected between the second lead of said second inductor and the positive terminal of the external power supply for selectively connecting the second lead of said second inductor to the positive terminal in response to a switch actuation signal.

11. A method for reversing a voltage polarity between a first electrode and a second electrode, comprising the steps of:

connecting the first electrode to a voltage polarity reversing circuit including a first inductor connected between the first electrode and a negative terminal of an external power supply; a diode having a cathode and an anode, the cathode being connected to the first electrode; a first capacitor connected between the anode of said diode and a positive terminal of the external power supply; a second inductor having a first lead and a second lead, the first lead being connected to the anode of said diode; a second capacitor connected between the second lead of said second inductor and the first electrode; and switching means connected between the second lead of said second inductor and the positive terminal of the external power supply for selectively connecting the second lead of said second inductor to the positive terminal in response to a switch actuation signal;

connecting the second electrode to the positive terminal of the external power supply;

generating the switch actuation signal to selectively switch said switching means from a non-conducting state to a conducting state.

12. The method of claim 11, further comprising the steps of:

detecting the occurrence of an arc condition between the first and second electrodes; and generating the switch actuation signal to switch said switching means from the non-conducting state to the conducting state when the arc condition is detected.

13. A circuit for reversing a voltage polarity on a first electrode and a second electrode, comprising:

a first inductor connected between the first electrode and a first terminal of an external power supply;

conductor means for connecting the second electrode to a second terminal of the external power supply;

energy transfer means connected between the first electrode and the second electrode for temporarily storing energy from said first inductor means;

switching means operatively associated with said energy transfer means and with the first and second electrodes for selectively electrically connecting said energy transfer means between the first and second electrodes; and voltage clamping means connected between the first and second electrodes for preventing the voltage potential between the first and second electrodes from exceeding a clamped voltage potential when said switching means is switched from a conducting state to a non-conducting state.

14. The circuit of claim 13, wherein said energy transfer means comprises an LC resonant circuit.

15. The circuit of claim 14, wherein said LC resonant circuit comprises:

a first capacitor having a first lead connected to the second electrode;

a second capacitor having a first lead connected to the first electrode; and a second inductor connecting a second lead of said first capacitor and a second lead of said second capacitor, the second lead of said second capacitor also being connected to said switching means.

16. The circuit of claim 15, wherein said clamping means includes a diode connected between the second lead of said first capacitor and the first electrode.

17. A circuit for reversing a voltage polarity on a first electrode and a second electrode, comprising:

a first inductor;

means for connecting said first inductor between the first electrode and a negative terminal of an external power supply;

means for connecting the second electrode to a positive terminal of the external power supply;

a diode having a cathode and an anode;

means for connecting the cathode of said diode to the first electrode;

a first capacitor;

means for connecting said first capacitor between the anode of said diode and the negative terminal of the external power supply;

a second inductor having a first lead and a second lead;

means for connecting the first lead of said second inductor to the anode of said diode;

a second capacitor;

means for connecting said second capacitor between the second lead of said second inductor and the first electrode; and switch means connected between the second lead of said second inductor and a positive terminal of the external power supply for selectively connecting the second lead of said second inductor to the positive terminal in response to a switch actuation signal.

18. The polarity reversing circuit of claim 17, further comprising switch actuation means connected to said switching means for periodically producing the switch actuation signal to switch said switching means from a non-conducting state to a conducting state.

19. The polarity reversing circuit of claim 18, further comprising arc detection means connected to said switch actuation means for detecting the occurrence an arc condition and for generating the switch actuation signal to switch said switching means from the non-conducting state to a conducting state when the arc condition is detected.

20. The polarity reversing circuit of claim 17, further comprising a first resistor connected in series between said second capacitor and the first electrode.

21. The polarity reversing circuit of claim 20, further comprising a second resistor connected in series between said switching means and the positive terminal of the external power supply.

22. The polarity reversing circuit of claim 21, wherein said switching means comprises a semiconductor switching device switchable from the non-conductive state to the conductive state in response to the switch actuation signal.

23. The polarity reversing circuit of claim 22, wherein the external power supply comprises a constant voltage power source.

* * * * *

UNITED STATES PATENT AND TRADEMARK OFFICE
CERTIFICATE OF CORRECTION

PATENT NO. : 5,682,067
DATED : October 28, 1997
INVENTOR(S) : Manley et al.

It is certified that error appears in the above-identified patent and that said Letters Patent are hereby corrected as shown below:

In the Specification

Column 1, line 67, delete "$Al_2O_3$" and insert therefor --$Al_2O_3$--.

Column 8, line 10, delete "megaohms" and insert therefor --milliohms--.

Column 8, line 11, delete "(M$\Omega$) to 100 M$\Omega$ (50 M$\Omega$ preferred)" and insert therefor --(m$\Omega$) 100 m$\Omega$ (50 m$\Omega$ preferred)--.

Column 8, line 32, delete "(Mf)" and insert therefor --($\mu$F)--.

Column 8, line 35, after "preferred" insert --)--.

Column 9, line 47, delete "(-)" and insert therefor -- - --.

Signed and Sealed this

Tenth Day of March, 1998

Attest:

BRUCE LEHMAN

Attesting Officer       Commissioner of Patents and Trademarks